United States Patent
Sandhu et al.

(10) Patent No.: US 7,618,901 B2
(45) Date of Patent: *Nov. 17, 2009

(54) PROCESS FOR GROWING A DIELECTRIC LAYER ON A SILICON-CONTAINING SURFACE USING A MIXTURE OF $N_2O$ AND $O_3$

(75) Inventors: Gurtej Singh Sandhu, Boise, UT (US); Randhir P S Thakur, Boise, UT (US)

(73) Assignee: Micron Technology, Inc., Boise, ID (US)

( * ) Notice: Subject to any disclaimer, the term of this patent is extended or adjusted under 35 U.S.C. 154(b) by 142 days.

This patent is subject to a terminal disclaimer.

(21) Appl. No.: 11/744,458

(22) Filed: May 4, 2007

(65) Prior Publication Data

US 2007/0207573 A1    Sep. 6, 2007

Related U.S. Application Data

(63) Continuation of application No. 11/075,187, filed on Mar. 8, 2005, now Pat. No. 7,235,498, and a continuation of application No. 10/642,705, filed on Aug. 18, 2003, now Pat. No. 6,864,125, and a continuation of application No. 09/059,718, filed on Apr. 13, 1998, now Pat. No. 6,607,946, and a continuation of application No. 08/651,563, filed on May 22, 1996, now abandoned.

(51) Int. Cl.
*C23C 16/40* (2006.01)

(52) U.S. Cl. .................. 438/770; 438/142; 438/769; 427/255.27

(58) Field of Classification Search .................. None
See application file for complete search history.

(56) References Cited

U.S. PATENT DOCUMENTS 3,924,024 A    12/1975  Naber et al.

(Continued)

FOREIGN PATENT DOCUMENTS

DE    4333160    3/1995

(Continued)

OTHER PUBLICATIONS

Itoh et al., "Formation of High-Quality Oxide/Nitride Stacker Layers on Rugged Polysilicon Electrodes by Rapid Thermal Oxidation", Jun. 1993, IEEE, pp. 1176-1178.

(Continued)

*Primary Examiner*—Zandra Smith
*Assistant Examiner*—Pamela E Perkins
(74) *Attorney, Agent, or Firm*—TraskBritt

(57) ABSTRACT

This invention is embodied in an improved process for growing high-quality silicon dioxide layers on silicon by subjecting it to a gaseous mixture of nitrous oxide ($N_2O$) and ozone ($O_3$). The presence of $O_3$ in the oxidizing ambiance greatly enhances the oxidation rate compared to an ambiance in which $N_2O$ is the only oxidizing agent. In addition to enhancing the oxidation rate of silicon, it is hypothesized that the presence of $O_3$ interferes with the growth of a thin silicon oxynitride layer near the interface of the silicon dioxide layer and the unreacted silicon surface which makes oxidation in the presence of $N_2O$ alone virtually self-limiting The presence of $O_3$ in the oxidizing ambiance does not impair oxide reliability, as is the case when silicon is oxidized with $N_2O$ in the presence of a strong, fluorine-containing oxidizing agent such as $NF_3$ or $SF_6$.

21 Claims, 1 Drawing Sheet

U.S. PATENT DOCUMENTS

| | | |
|---|---|---|
| 4,002,512 A | 1/1977 | Lim |
| 4,113,515 A | 9/1978 | Looi et al. |
| 4,621,277 A | 11/1986 | Ito et al. |
| 4,784,975 A | 11/1988 | Hofmann et al. |
| 5,244,843 A | 9/1993 | Chau et al. |
| 5,294,571 A | 3/1994 | Fujishiro et al. |
| 5,393,683 A | 2/1995 | Mathews et al. |
| 5,397,720 A | 3/1995 | Kwong et al. |
| 5,434,090 A | 7/1995 | Chiou et al. |
| 5,580,815 A | 12/1996 | Hsu et al. |
| 5,656,516 A | 8/1997 | Suzuki |
| 5,674,788 A | 10/1997 | Wristers et al. |
| 6,607,946 B1 | 8/2003 | Sandhu et al. |
| 6,864,125 B2 | 3/2005 | Sandhu et al. |

FOREIGN PATENT DOCUMENTS

| | | |
|---|---|---|
| JP | 4075354 | 3/1992 |
| JP | 5343421 | 12/1993 |
| JP | 8078693 | 3/1996 |

OTHER PUBLICATIONS

Okada et al., "The Performance and Reliability of 0.4 Micron MOSFET's with Gate Oxynitrides Grown by Rapid Thermal Processing Using Mixtures of N2 and O2", Feb. 1994, IEEE, pp. 191-197.

PROCESS FOR GROWING A DIELECTRIC LAYER ON A SILICON-CONTAINING SURFACE USING A MIXTURE OF N₂O AND O₃

CROSS-REFERENCE TO RELATED APPLICATIONS

This application is a continuation of application Ser. No. 11/075,187, filed Mar. 8, 2005, now U.S. Pat. No. 7,235,498, issued Jun. 26, 2007, which is a continuation of application Ser. No. 10/642,705, filed Aug. 18, 2003, now U.S. Pat. No. 6,864,125, issued Mar. 8, 2005, which is a continuation of application Ser. No. 09/059,718, filed Apr. 13, 1998, now U.S. Pat. No. 6,607,946, issued Aug. 19, 2003, which is a continuation of application Ser. No. 08/651,563, filed on May 22, 1996, now abandoned. The disclosures of the previously referenced U.S. patent applications referenced are hereby incorporated by reference in its entirety.

BACKGROUND OF THE INVENTION

1. Field of the Invention

This invention relates to integrated circuit manufacturing technology and, more specifically, to processes for growing insulative layers by consumption of an underlying layer.

2. State of the Art

In the manufacturing of integrated circuits, the growth of high-quality insulative layers for device isolation, transistor gate dielectrics and capacitor dielectrics is of fundamental importance. As device dimensions are scaled down, thinner dielectric layers are required to maintain capacitor and transistor performance at acceptable levels. When silicon dioxide layers, which have been grown by conventional wet or dry thermal oxidation processes, are thinned, device reliability typically suffers. It is generally believed that the quality of silicon dioxide layers is inversely proportional to the number of interface states (i.e., dangling silicon bonds) present per unit volume. In other words, quality and long-term reliability of a silicon dioxide layer will increase as the number of dangling silicon bonds is reduced.

Oxidation of silicon in an ambient-containing nitrous oxide ($N_2O$) has been reported as a means for improving the quality of silicon dioxide dielectric layers. A lower number of interface states, greater reliability, improved hot carrier immunity and improved diffusion barrier characteristics have been reported for silicon dioxide layers grown in this manner as compared to those grown via conventional dry or wet oxidation processes. The increased reliability of such dielectric layers may be due in part to the incorporation of nitrogen atoms into the silicon dioxide matrix. The bonds between silicon atoms and nitrogen atoms are considerably stronger than those between silicon atom and oxygen atoms. Thus, the presence of nitrogen atoms in the matrix apparently fortifies the dielectric layer against voltage-induced degradation. However, the process of oxidizing silicon in nitrous oxide tends to be self-limiting because the silicon dioxide layer which forms has a high nitrogen content. In fact, the layer may be better identified as silicon oxynitride. Once a thin layer of silicon oxynitride has formed on the surface, the diffusion of oxidant species to the underlying silicon is greatly hampered. Thus, only very thin dielectric layers are readily grown using this process.

Although the addition of small amounts of a strong oxidizer such as $SF_6$ or $NF_3$ to a nitrous oxide ambiance has been demonstrated to increase the oxidation rate by as much as one order of magnitude, the inclusion of fluorine in a silicon dioxide layer has been shown to have an adverse impact on device reliability.

What is needed is an improved process for oxidizing silicon which utilizes nitrous oxide as the primary oxidant species, and which does not rely on fluorine-containing additives to overcome the self-limiting nature of the reaction. Such a process might produce silicon dioxide layers having both a low number of interface states and a sufficient thickness for use as transistor gate dielectrics.

BRIEF SUMMARY OF THE INVENTION

An improved process for growing high-quality silicon dioxide films or layers on a silicon surface in a nitrous oxide-containing ambiance is disclosed. The silicon surface is subjected to a gaseous mixture of nitrous oxide ($N_2O$) and ozone ($O_3$). The presence of $O_3$ in the oxidizing ambiance greatly enhances the oxidation rate compared to an ambiance in which $N_2O$ is the only oxidizing agent. It is hypothesized that the presence of $O_3$ promotes growth of a dielectric layer that is predominantly silicon dioxide, although small numbers of nitrogen atoms are incorporated in the silicon dioxide matrix. Thus, a silicon oxynitride layer (i.e., a silicon dioxide layer having a high nitrogen content) having a high degree of impermeability to the oxidant species is prevented from forming. The presence of $O_3$ in the oxidizing ambiance does not impair oxide reliability, as is the case when silicon is oxidized with $N_2O$ in the presence of a strong, fluorine-containing oxidizing agent such as $NF_3$ or $SF_6$.

DETAILED DESCRIPTION OF THE INVENTION

Figure 1:
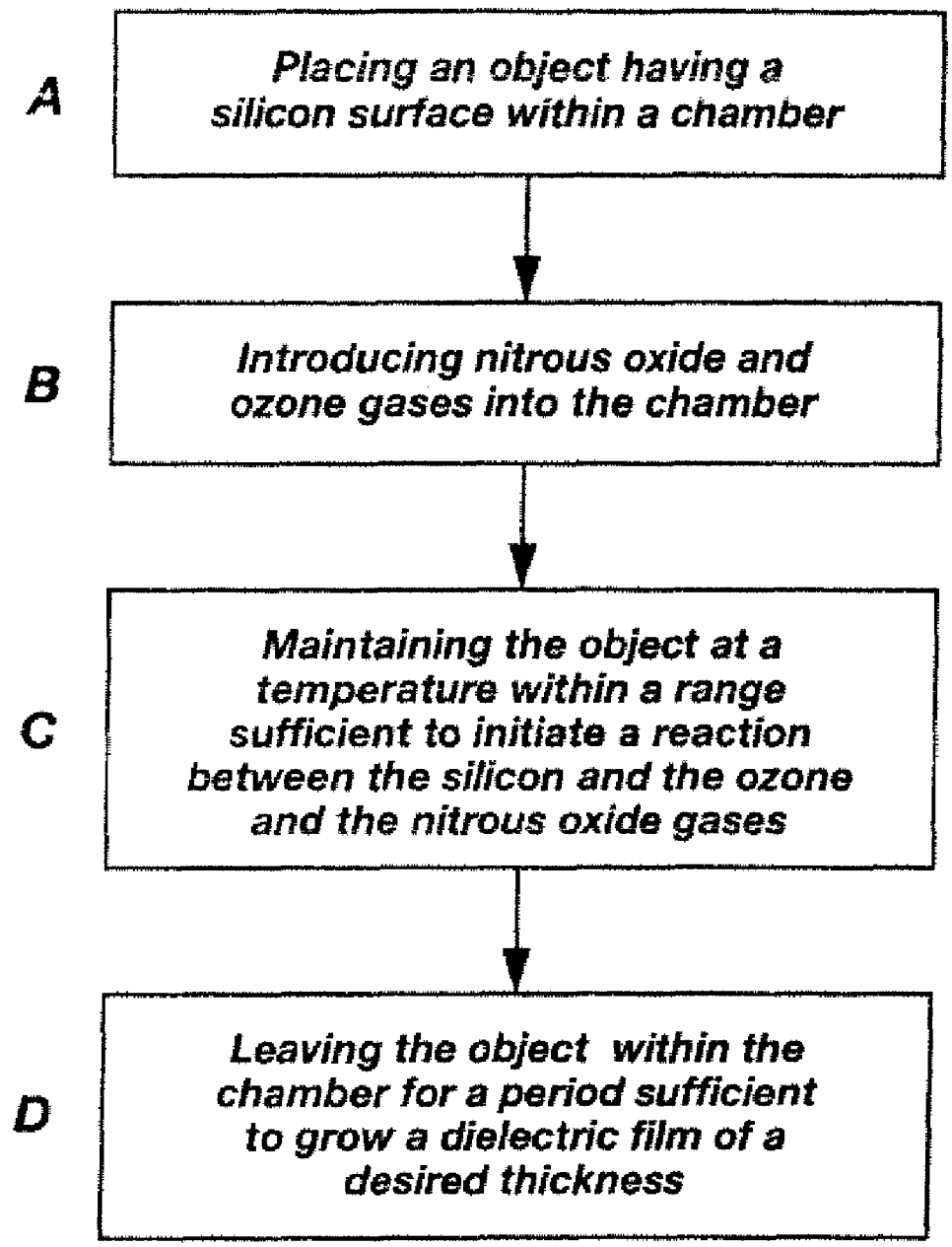
FIG. 1 is a flow chart which outlines the steps of a preferred embodiment of the process.

This invention is disclosed in the context of a process for growing high-quality dielectric films or layers on the surface of a silicon-containing layer or substrate. The surface is subjected to a gaseous mixture of nitrous oxide ($N_2O$) and ozone ($O_3$). The partial pressures of ozone should, preferably, be at least 10 percent of that of nitrous oxide in order to sustain an acceptable oxidation rate. Although the dielectric layers grown by this process are predominantly silicon dioxide, small numbers of nitrogen atoms are incorporated in the silicon dioxide matrix.

It is axiomatic that as the partial pressure of ozone with respect to that of nitrous oxide decreases, the nitrogen content of the dielectric film will increase and the reaction rate will decrease. When a silicon-containing layer is oxidized in an ambiance in which $N_2O$ is the sole oxidant, a layer of silicon oxynitride forms on the surface of the silicon-containing layer. This silicon oxynitride layer contains sufficient amounts of silicon nitride so that diffusion of $N_2O$ to the underlying silicon-containing layer is greatly hampered. The presence of $O_3$ in the oxidizing ambiance greatly enhances the oxidation rate compared to an ambiance in which $N_2O$ is the only oxidizing agent. Thus, it is hypothesized that the presence of $O_3$ in the oxidizing ambiance decreases the amount of nitrogen (in the form of silicon nitride) that is incorporated in the silicon dioxide matrix. The presence of $O_3$ in the oxidizing ambiance does not impair oxide reliability, as is the case when silicon is oxidized with $N_2O$ in the presence of a strong, fluorine-containing oxidizing agent such as $NF_3$ or $SF_6$.

Oxidation of a silicon surface in the presence of ozone and nitrous oxide may be accomplished in a variety of ways which relate to the apparatus in which the reaction is performed, the temperature at which the reaction is performed, the pressure at which the reaction is performed, and the presence of other chemical species during the reaction.

The process may be performed within a sealed chamber or in an unsealed chamber such as a rapid thermal anneal chamber that is open to the atmosphere. In such an open chamber, the silicon surface is bathed in the oxidizing ambiance. In an open chamber, the reaction proceeds at or near atmospheric pressure However, in a sealed chamber, the reaction may be performed at pressures greater or less than atmospheric pressure. A range of 1 to 7,600 torr is deemed to be a useful pressure range for the reaction.

Likewise, the process may be performed within a wide temperature range. A useful temperature range for the reaction in a manufacturing environment is deemed to be 600° C. to 1100° C. The limit of 1100° C. is considered to be the maximum desirable temperature for the processing of integrated circuits fabricated on a silicon substrate. Below 600° C., the reaction rate drops off significantly.

FIG. 1 provides a flow chart that summarizes the steps of a preferred embodiment of the dielectric layer formation process. Step A indicates that the object to be placed in the chamber has a silicon surface. Although the surface will normally be a material that, compositionally, is relatively pure silicon, such as single crystalline or polycrystalline silicon, the silicon may incorporate low levels of impurities such as dopants.

Still referring to FIG. 1, step B recites that nitrous oxide and ozone gases are introduced into the chamber. Because of reliability problems associated with the use of fluorine during oxidation, the mixture should, ideally, contain no fluorine-containing gases. However, the oxidizing ambiance, in addition to ozone and nitrous oxide, may also contain trace amounts of chlorine or bromine-containing gases, such as $Cl_2$, $Br_2$, HCl or HBr. The environment may also contain steam. The amounts of the halogens or halogen compounds present are chosen such that halogen etching is not the dominant mechanism. If employed at all, concentrations of the halogens or halogen compounds relative to the concentration of ozone are contemplated to be in the range of no greater than 1:10. However, relative concentrations within a range of 1:1,000 to 1:100 are deemed preferable. In another embodiment of the process, the oxidizing ambiance may also contain steam. Also contemplated are oxidizing environments containing not only ozone and nitrous oxide, but combinations of one or more of the aforenamed halogen-containing gases or one or more of the aforenamed halogen-containing gases and steam. Silicon wafers may be processed individually in a single wafer processor, or multiple wafers may be processed in a conventional vertical thermal reactor.

Still referring to FIG. 1, step C indicates that the object should be maintained at a temperature within a range sufficient to initiate a reaction between the silicon on the surface of the object and the ozone and nitrous oxide gases. Although, at least from a theoretical standpoint, a certain amount of oxidation may occur at temperatures considerably less than 100° C., the pace of the oxidation reaction at such temperatures is so slow as to be totally impractical from a manufacturing standpoint. Step D of FIG. 1 is, of course, a logical requirement for any manufacturing-worthy process, as film thickness must normally be carefully monitored.

Silicon dioxide dielectric layers grown with the new silicon oxidation process may be utilized in applications wherever conventionally grown silicon dioxide layers are used. Such applications include use as capacitor dielectrics, use in field oxide layers grown via conventional local oxidation of silicon (LOCOS) processes or via modified LOCOS processes, and use as both floating gate and control gate dielectric layers for field-effect transistors.

Although only several embodiments of the invention have been disclosed herein, it will be obvious to those having ordinary skill in the art of integrated circuit manufacture that modifications and changes may be made thereto without departing from the scope and the spirit of the invention as hereinafter claimed.

What is claimed is:

1. A method of forming a film on a surface containing silicon comprising:
   introducing into a chamber a gaseous mixture including nitrous oxide having a partial pressure, ozone having a partial pressure, and at least one compound containing a halogen and steam, the partial pressure of the ozone being at least one tenth the partial pressure of the nitrous oxide in the gaseous mixture, the gaseous mixture being substantially free of fluorine-containing gases; and
   forming the film by contacting at least a portion of the surface containing silicon with the gaseous mixture including nitrous oxide, ozone, and the at least one compound containing a halogen and steam, the gaseous mixture being substantially free of fluorine-containing gases.

2. The method of claim 1, wherein the chamber is sealed.

3. The method of claim 2, wherein the chamber is maintained at a pressure within a range of about 1 to about 7,600 torr.

4. The method of claim 1, wherein the film forms at a temperature in the range of about 600° C. to about 1100° C.

5. A method of coating a surface comprising:
   introducing into a chamber a gaseous mixture reacting with silicon for forming a coating, the gaseous mixture including nitrous oxide having a partial pressure, ozone having a partial pressure, at least one compound containing a halogen and steam, the partial pressure of the ozone being less than one tenth the partial pressure of the nitrous oxide in the gaseous mixture, the gaseous mixture being substantially free of fluorine; and
   forming the coating by contacting at least a portion of the surface of the layer containing silicon with the gaseous mixture including nitrous oxide, ozone, the at least one compound containing a halogen and steam, the gaseous mixture being substantially free of fluorine containing gases.

6. The method of claim 5, wherein the chamber is sealed.

7. The method of claim 6, wherein the chamber is maintained at a pressure within a range of about 100 to about 7,500 torr.

8. The method of claim 5, wherein the coating forms at a temperature in the range of above 600° C. to less than about 1100° C.

9. A method of forming insulation on a surface comprising:
   introducing into a chamber a gaseous mixture reacting with silicon for forming a coating, the gaseous mixture including nitrous oxide having a partial pressure, ozone having a partial pressure, at least one compound containing a halogen and steam, the partial pressure of the ozone being less than one tenth the partial pressure of the nitrous oxide in the gaseous mixture, the gaseous mixture being substantially free of fluorine; and
   forming the insulation by contacting at least a portion of the surface of the layer containing silicon with the gaseous mixture including nitrous oxide, ozone, the at least one compound containing a halogen and steam, the gaseous mixture being substantially free of fluorine containing gases.

10. The method of claim 9, wherein the chamber is sealed.

11. The method of claim 10, wherein the chamber is maintained at a pressure within a range of about 10 to about 7,550 torr.

12. The method of claim 9, wherein the insulation forms at a temperature in the range of about 700° C. to about 1000° C.

13. A process for forming a field-effect transistor gate dielectric layer on an exposed surface of a layer of polycrystalline silicon having a desired thickness in a chamber, the process comprising:
    leaving the layer of polycrystalline silicon within the chamber for a period sufficient to grow the desired thickness of the field-effect transistor gate dielectric layer, the field-effect transistor gate dielectric layer containing silicon dioxide and silicon nitride formed on the exposed surface of the layer of polycrystalline silicon maintained at a temperature in the range of essentially about 600° C. to about 1100° C. in an oxidizing atmosphere in a gaseous mixture including nitrous oxide, ozone, at least one compound containing a halogen and steam, the gaseous mixture being substantially free of fluorine-containing gases; and
    forming the field-effect transistor gate dielectric layer to the desired thickness by subjecting the exposed surface of the layer of polycrystalline silicon to the gaseous mixture, the gaseous mixture including nitrous oxide at a partial pressure and ozone at a partial pressure, the partial pressure of the ozone being essentially one tenth the partial pressure of the nitrous oxide.

14. The process of claim 13, wherein the chamber is sealed.

15. The process of claim 14, wherein the chamber is maintained at a pressure within a range of about 50 to about 7,500 torr.

16. A method of forming a dielectric film on an exposed surface of a layer containing silicon comprising:
    forming in a chamber a gaseous mixture including nitrous oxide exhibiting a partial pressure, ozone exhibiting a partial pressure, at least one compound containing a halogen selected from the group consisting of $Cl_2$, $Br_2$, HCl and HBr, and steam, the partial pressure of the ozone being at least one tenth the partial pressure of the nitrous oxide in the gaseous mixture, the gaseous mixture being substantially free of fluorine-containing gases forming the dielectric film of the desired thickness by contacting the exposed surface of the layer containing silicon with the gaseous mixture including nitrous oxide, ozone, at least one compound containing a halogen selected from the group consisting of $Cl_2$, $Br_2$, HCl and HBr, and steam.

17. The method of claim 16, wherein the chamber is sealed.

18. The method of claim 16, wherein the chamber is maintained at a pressure within a range of about 500 to about 7,000 torr.

19. A method of forming a field-effect transistor gate dielectric layer on an exposed surface of a layer of polycrystalline silicon comprising:
    using a gaseous mixture including nitrous oxide, ozone, at least one compound containing a halogen selected from the group consisting of $Cl_2$, $Br_2$, HCl and HBr, and steam, the gaseous mixture being substantially free of fluorine-containing gases for forming the field-effect transistor gate dielectric layer to a desired thickness by subjecting the exposed surface of the layer of polycrystalline silicon to the gaseous mixture, the gaseous mixture including nitrous oxide at a partial pressure and ozone at a partial pressure, the partial pressure of the ozone being at least about one tenth the partial pressure of the nitrous oxide.

20. The method of claim 19, wherein a chamber is used.

21. The method of claim 19, wherein the layer forms at a temperature in the range of essentially less than about 600° C. to essentially about 1100° C.

\* \* \* \* \*

UNITED STATES PATENT AND TRADEMARK OFFICE
CERTIFICATE OF CORRECTION

PATENT NO. : 7,618,901 B2  Page 1 of 1
APPLICATION NO. : 11/744458
DATED : November 17, 2009
INVENTOR(S) : Gurtej Singh Sandhu et al.

It is certified that error appears in the above-identified patent and that said Letters Patent is hereby corrected as shown below:

On the Title page, in field (75), in "Inventors", in column 1, line 1, delete "UT (US);" and insert -- ID (US); --, therefor.

On the Title page, in field (75), in "Inventors", in column 1, line 2, delete "UT (US);" and insert -- ID (US); --, therefor.

On the Title page, in field (57), under "Abstract", in column 2, line 11, after "self-limiting" insert -- . --.

Signed and Sealed this

Twenty-sixth Day of January, 2010

David J. Kappos
*Director of the United States Patent and Trademark Office*